(12) United States Patent
Kim

(10) Patent No.: US 7,778,058 B2
(45) Date of Patent: Aug. 17, 2010

(54) FLASH MEMORY DEVICE WHICH INCLUDES STRAPPING LINE CONNECTED TO SELECTION LINE

(75) Inventor: Chan-Ho Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 845 days.

(21) Appl. No.: 11/657,077

(22) Filed: Jan. 24, 2007

(65) Prior Publication Data

US 2008/0080246 A1 Apr. 3, 2008

(30) Foreign Application Priority Data

Sep. 29, 2006 (KR) .................. 10-2006-0095908

(51) Int. Cl.
*G11C 5/06* (2006.01)
(52) U.S. Cl. ................ 365/63; 365/185.02; 365/185.17
(58) Field of Classification Search .................. 365/63, 365/185.02, 185.17
See application file for complete search history.

(56) References Cited

U.S. PATENT DOCUMENTS

| | | | | |
|---|---|---|---|---|
| 5,043,942 A | * | 8/1991 | Iwata et al. ............ 365/185.13 |
| 5,708,620 A | * | 1/1998 | Jeong .................... 365/230.06 |
| 6,559,514 B2 | * | 5/2003 | Morikawa ................... 257/499 |
| 6,611,460 B2 | * | 8/2003 | Lee et al. ............... 365/185.18 |
| 6,738,290 B2 | * | 5/2004 | Lee et al. ............... 365/185.17 |
| 7,176,078 B2 | * | 2/2007 | Kim .......................... 438/201 |
| 7,352,625 B2 | * | 4/2008 | Futatsuyama et al. .. 365/185.18 |
| 7,570,517 B2 | * | 8/2009 | Kwak et al. ............. 365/185.17 |

FOREIGN PATENT DOCUMENTS

| | | |
|---|---|---|
| JP | 09-282884 | 10/1997 |
| JP | 11-135724 | 5/1999 |
| JP | 2001-024070 | 1/2001 |
| KR | 1020030013141 | 2/2003 |
| KR | 1020050102769 A | 10/2005 |
| KR | 1020060000741 A | 1/2006 |

OTHER PUBLICATIONS

Inoue et al. "NAND Flash Applications Design Guide: System Solutions from Toshiba America Electronic Components, Inc." Apr. 2003. pp. 1-29.*

* cited by examiner

*Primary Examiner*—Dang T. Nguyen
*Assistant Examiner*—Alexander Sofocleous
(74) *Attorney, Agent, or Firm*—Volentine & Whitt, PLLC (57) ABSTRACT

A NAND flash array includes a first selection transistor coupled to a first selection line, a second selection transistor coupled to a second selection line, memory cells operably coupled to word lines and connected to each other in series between the first and second selection transistors, and a strapping line electrically connected to the first selection line.

20 Claims, 6 Drawing Sheets

FLASH MEMORY DEVICE WHICH INCLUDES STRAPPING LINE CONNECTED TO SELECTION LINE

BACKGROUND OF THE INVENTION

1. Field of the Invention

The present disclosure relates generally to semiconductor memory devices and, more particularly, to electrically erasable and programmable semiconductor memory devices.

A claim of priority under 35 U.S.C. §119 is made to Korean Patent Application No. 2006-95908 filed on Sep. 29, 2006, the entire contents of which are hereby incorporated by reference.

2. Background of the Invention

Semiconductor memories are widely used in electronic components such as, for example, digital logic circuits and microprocessors. These and other such components may be used in a wide variety of applications ranging from satellite communications to consumer electronics. As demands such as reduction in size and increased operating speed in these applications increase, there is a corresponding demand for features such as high integration density and high frequency of operation from semiconductor devices. There is therefore a need to improve the technologies used in manufacturing semiconductor memories to fulfill such demands.

The semiconductor memory devices are generally classified into volatile memory devices and nonvolatile memory devices. In volatile semiconductor memory devices, information is stored on a temporary basis. This may be done in a number of ways. For example, in a volatile memory device, logical information may be stored by setting a logic condition of a bistable flipflop loop as in a static random access memory (SRAM) or by a capacitive charging effect as in a dynamic random access memory (DRAM.) Furthermore, the volatile semiconductor memory stores and reads data when powered on, but looses the stored data when power is cut off.

On the other hand, the nonvolatile semiconductor memories, such as, for example, MROM, PROM, EPROM, and EEPROM, are able to retain their data even when power supply is cut off. Furthermore, a storage condition in the nonvolatile memory may be designed to be either immutable or re-programmable in accordance with the fabrication techniques used to manufacture the semiconductor memory. Because of their ability, among other things, to retain data in the absence of power, nonvolatile semiconductor memory devices are used in a wide variety of applications. For example, nonvolatile memory devices are used for storing program files and micro-codes in applications such as, for example, computers, aerospace engineering, electronic engineering, communications, and customer electronics.

Among the nonvolatile semiconductor memories, MROM, PROM, and EPROM have features that may make it inconvenient for general users to reprogram these devices. The difficulty in reprogramming these devices lies in the design features of these devices which make it difficult to erase and write data to these devices. On the other hand, an EEPROM can be electrically erased and programmed with data. The ability to electrically erase and program an EEPROM memory makes the EEPROM memory widely popular with general users of electronic devices. Furthermore, flash EEPROMs (hereinafter, referred to as 'flash memory devices') can be fabricated with high integration density without compromising their ability to store large amounts of data. This feature makes flash EEPROMs popular as large-capacity auxiliary storage units.

Figure 1:
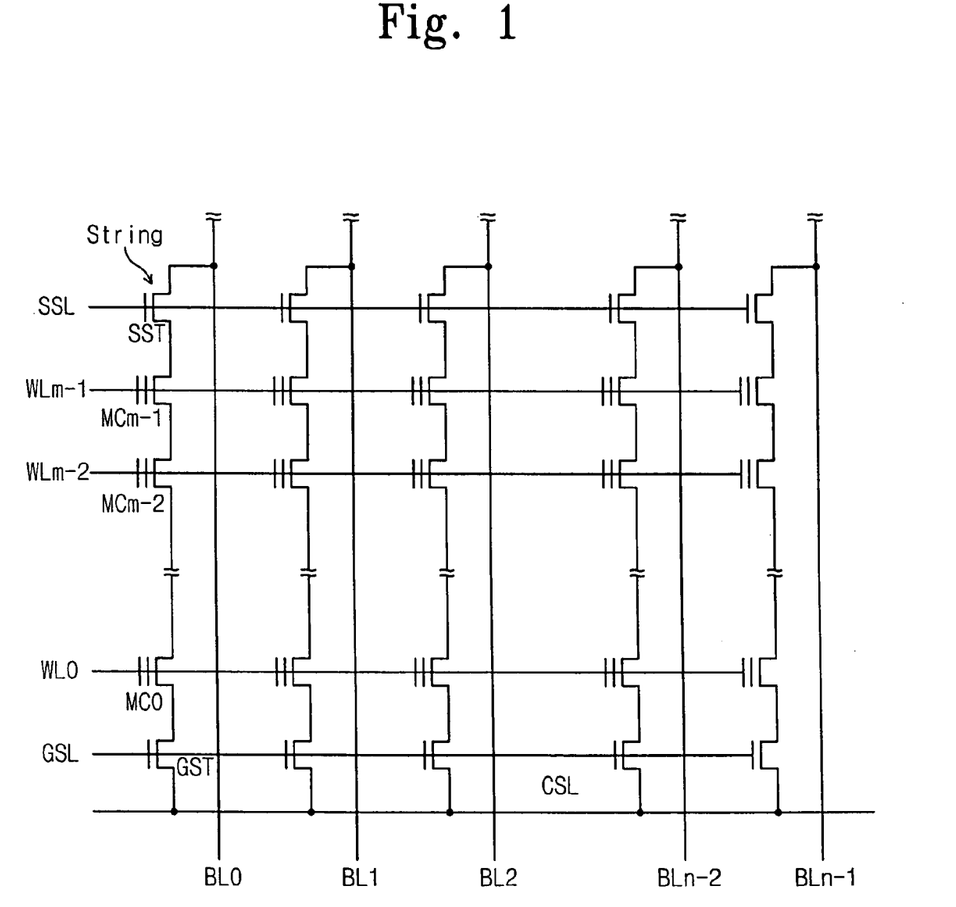
FIG. 1 is a circuit diagram illustrating an array structure in a flash memory device.

A flash memory device generally includes an array of memory cells. Typically, each memory cell is formed of a floating gate transistor. Furthermore, the memory cell array is composed of a plurality of memory blocks. Each memory block, as shown in FIG. 1, includes strings, (referred even to as 'NAND strings' or 'NAND unit') each of which is formed of the floating gate transistors MCm~MC0. In addition, the floating gate transistors are serially connected between a string selection transistor SST and a ground selection transistor GST, both of which are part of each string. Furthermore, the strings are electrically coupled to bit lines BL0~BLn−1. Moreover, a plurality of word lines WL0~WLm−1 are arranged such that they intersect with the NAND strings. Specifically, the plurality of word lines WL0~WLm−1 are coupled to control gates of the floating gate transistors in the NAND strings.

Before floating gate transistors, i.e., memory cells, are programmed, the floating gate transistors are first erased to have negative threshold voltages (e.g., −1V or lower than 0V). This step may ensure that any data that was inadvertently present in the cell is removed before new data is programmed in the cell. While programming the memory cell, a high voltage is applied to a word line of a selected memory cell for a predetermined time. Upon application of this high voltage, the voltage level in the selected memory cell changes to have a higher threshold voltage, while the rest of the memory cells, i.e., deselected cells, maintain their threshold voltages without any changes to their voltage level.

However, applying a high threshold voltage to a word line including the memory cell to be programmed in the manner mentioned above may lead to problems. Specifically, the deselected memory cells that are connected to the word line including the selected cell may be inadvertently programmed when the high voltage is applied to the selected word line. This inadvertent programming of the deselected memory cells coupled to the selected word line is called 'program disturbance'.

One technique for preventing program disturbance is program inhibition using a self-boosting scheme. In particular, methods of program inhibition with the self-boosting scheme are disclosed in U.S. Pat. No. 5,677,873 entitled 'METHOD OF PROGRAMMING FLASH EEPROM INTEGRATED CIRCUIT MEMORY DEVICES TO PRE VENT INADVERTENT PROGRAMMING OF NONDESIGNATED NAND MEMORY CELLS THEREIN', and U.S. Pat. No. 5,991,202 entitled 'METHOD FOR REDUCING PROGRAM DISTURB DURING SELF-BOOSTING IN A NAND FLASH MEMORY', both of which are incorporated by reference in this application.

In general, in a method of program inhibition using such a self-boosting scheme, a current path toward a ground voltage is interrupted by applying a voltage of 0V to a gate of the ground selection transistor GST. That is, the voltage of 0V is applied to the ground selection line GSL. In addition, a selected bit line is supplied with 0V as a program voltage while a deselected bit line is supplied with a power source voltage (Vcc) as a program-inhibition voltage. Particularly, the power source voltage is applied to a gate of the string selection transistor SST, i.e., to the string selection line SSL, and a pass voltage (Vpass) is applied to all of the word lines. This bias condition of voltages makes the string selection transistor SST shut off after charging a source of the string selection transistor SST up to Vcc-Vth (Vth is a threshold voltage of the string selection transistor). During this process, a channel voltage of a program-inhibited memory cell is boosted up, which prevents the F-N tunneling effect between its floating gate and channel. As a result, the program-inhibited cell transistor is maintained in its initial erased state. Thus, when the program voltage Vpgm is applied to the selected word line, only a selected memory cell is programmed by the F-N tunneling effect.

Figure 2:
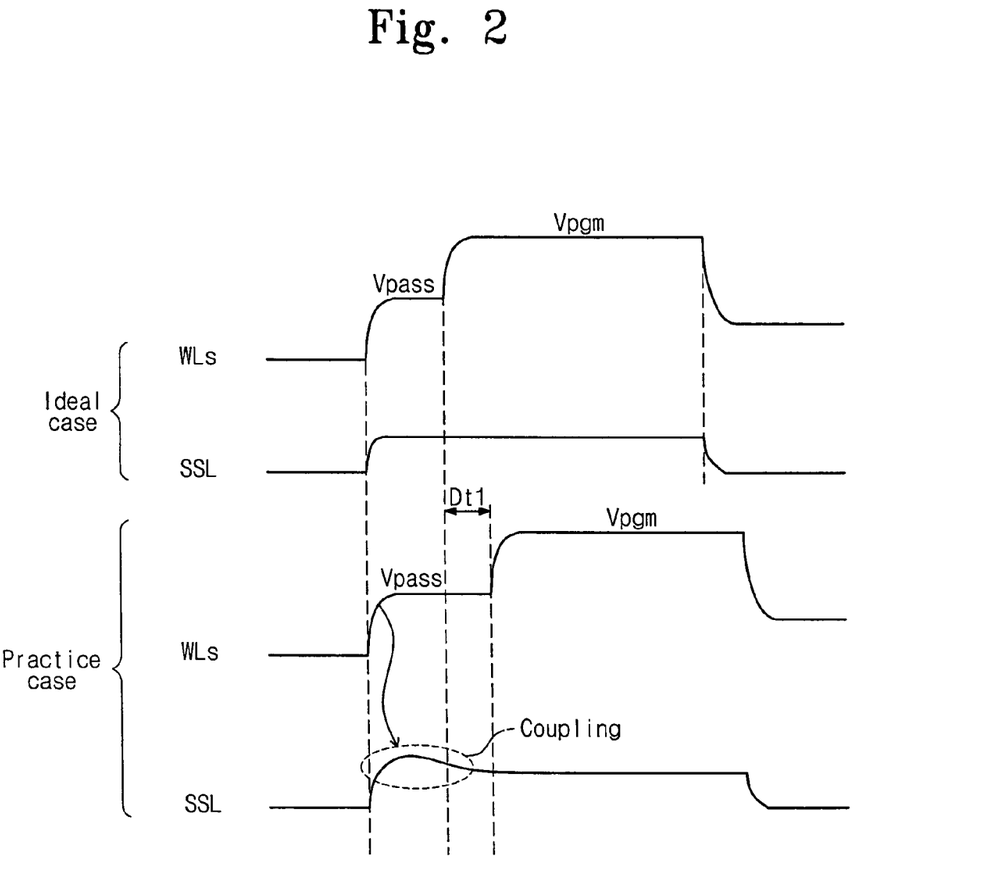
FIG. 2 is a waveform diagram illustrating one or more problems due to an RC loading effect on a string selection line.

Ideally, as shown in FIG. 2, a voltage of the string selection line SSL would be at a target voltage when the pass voltage Vpass is applied to the word lines. However, in most cases, the voltage of the string selection line SSL may be boosted up by a coupling effect with its adjacent word line when the pass voltage Vpass is applied to the word lines. In many cases, the shut-off string selection transistor SST is turned on when the voltage of the string selection line SSL is boosted over the target voltage. Furthermore, the string selection transistor SST may remain in the on state for a limited period of time. This is because, after some time, the boosted voltage of the string selection line SSL returns to the target voltage.

The time during which the boosted voltage of the string selection line SSL recovers to the target voltage (hereinafter, referred to as 'stabilizing time') normally depends on a pattern of RC loading on the string selection line SSL. Specifically, such a stabilizing time may be directly proportional to the RC loading. Furthermore, because of the unwanted boosting of the SSL voltage and the subsequent time taken for the boosted voltage to return to the target value (shown by Dt1 in FIG. 2), the application of the program voltage Vpgm to the selected word line is delayed. Moreover, because of this delay in applying the program voltage Vpgm to the selected word line, an overall programming time may increase. This problem would be exacerbated in a multi-bit flash memory device that requires many more program loops than a single-bit flash memory device. Furthermore, when the shut-off string selection transistor SST is turned on by the boosted voltage of the string selection line SSL, a channel voltage of the program-inhibited memory cell may be lowered. This reduction of the channel voltage causes the program disturbance aforementioned, thus decreasing a window margin of the pass voltage. In addition, the aforementioned problems would be more serious due to signal skew on the string selection line SSL. Signal skew occurs because of the difference in the distances between different SSTs on the SSL from a row decoder.

The present disclosure is directed towards overcoming one or more of the shortcomings listed above in conventional flash memory programming operations.

SUMMARY OF THE INVENTION

An aspect of the present disclosure includes a NAND flash array. The NAND flash array includes a first selection transistor coupled to a first selection line, a second selection transistor coupled to a second selection line, memory cells operably coupled to word lines and connected to each other in series between the first and second selection transistors, and a strapping line electrically connected to the first selection line.

Another aspect of the present disclosure includes a NAND flash array. The array includes a first selection transistor coupled to a first selection line, a second selection transistor coupled to a second selection line, memory cells operably coupled to word lines and connected in series between the first and second selection transistors, a first strapping line electrically connected to the first selection line, and a second strapping line electrically connected to the second selection line.

Yet another aspect of the present disclosure includes a NAND flash array. The NAND flash array includes a cell region including memory cells, a strapping region including bit lines, disposed in the cell region, a string selection line arranged in the cell region, a ground selection line arranged in the cell region, word lines arranged between the string and ground selection lines, and a first strapping line electrically connected to the string selection line through a first contact pad formed of the bit lines in the strapping region.

Yet another aspect of the present disclosure includes a NAND flash array. The NAND flash array includes a plurality of memory blocks, wherein each memory block comprises a plurality of strings, each string being connected to a first bit line, wherein each string comprises a string selection transistor connected to a string selection line, a ground selection transistor connected to a ground selection line and a common source line, memory cells operably coupled to word lines and connected to each other in series between the string and ground selection transistors, and a first strapping line electrically connected to the string selection line.

A further understanding of the nature and features of the present invention herein may be realized by reference to the remaining portions of the specification and the attached drawings.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF PREFERRED EMBODIMENTS

Exemplary embodiments of the present invention will be described below in more detail with reference to the accompanying drawings, showing a flash memory device as an example for illustrating structural and operational features by the invention. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

Figure 3:
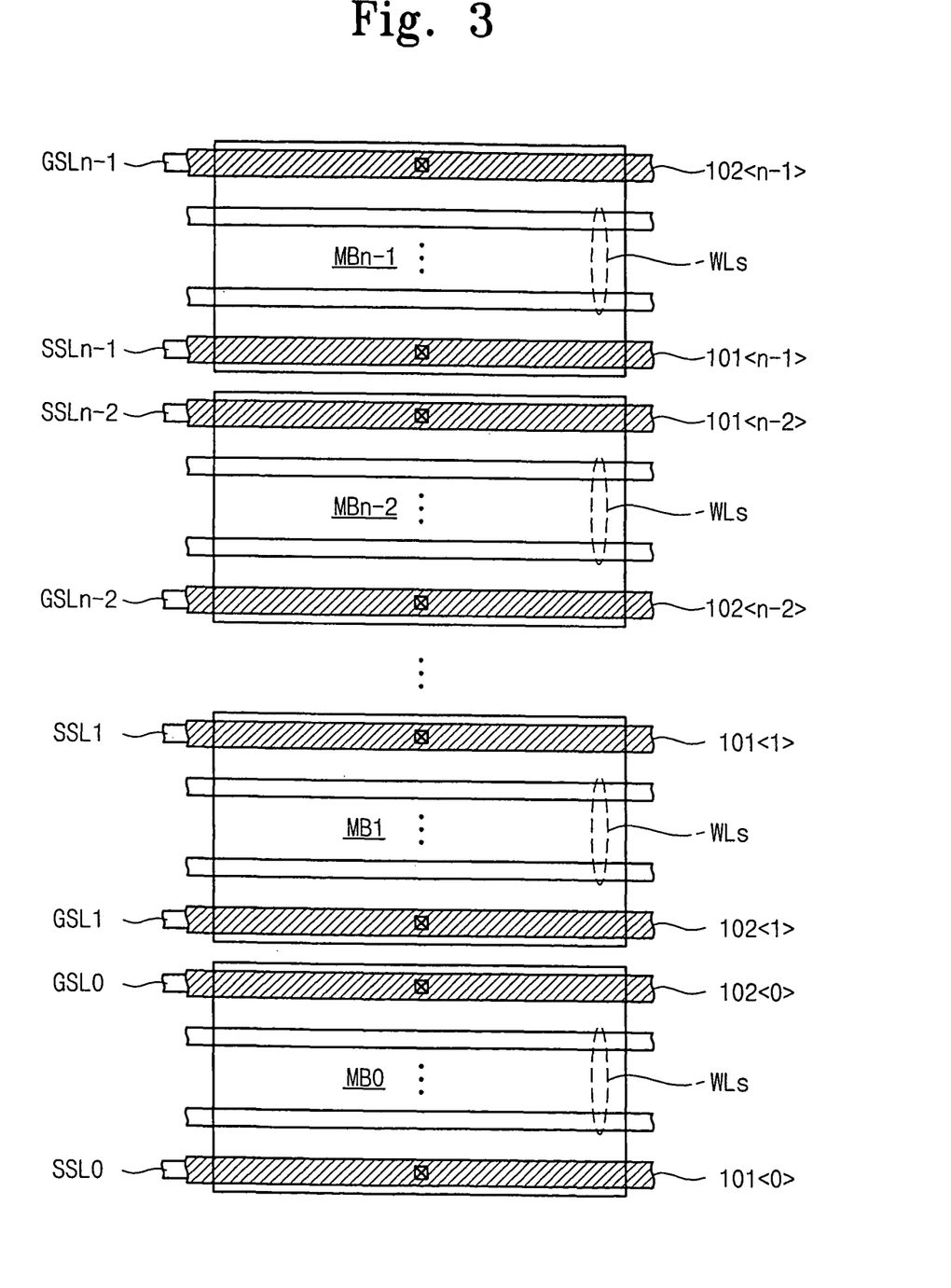
FIG. 3 is a diagram illustrating an array structure of a flash memory device in accordance with an exemplary disclosed embodiment.

In an exemplary embodiment, a flash memory device is configured with features that may overcome problems such as, for example, signal skew on a string selection line, an increase in programming time, a reduction of pass voltage window margin, etc. Specifically, resistive components of the string selection line can be reduced by forming an electrical connection between a string selection line and a metal line. For example, as illustrated in FIG. 3, string selection lines SSLi (i=0~n−1) arranged in each of memory blocks MB0~MBn−1 are electrically connected to metal lines 101<i> (i=0~n−1). This electrical connection may be formed in many ways. For example, this electrical connection may be formed by way of interconnection elements such as contact plugs. Specifically, as detailed later, the interconnection elements may be implemented by utilizing bit-line contact pads. While the metal lines 101<i> are arranged over the string selection lines SSLi for convenience of illustration, their arrangement pattern may not be restricted thereto. For example, it is permissible for the metal lines 101<i> to be arranged in a manner such that the metal lines 101<i> do not overlap with the string selection lines SSLi.

Furthermore, ground selection lines GSL0~GSLn−1 are each electrically connected to metal lines 102i (i=0~n−1) in the same manner as the string selection lines SSL0~SSLn−1. In an exemplary embodiment, the metal lines 101<i> and 102<1> may be used as strapping lines. Furthermore, while FIG. 3 illustrates that the string selection and metal lines are electrically interconnected with each other just at one point, it is permissible to form electrical interconnections between the string selection and metal lines at numerous positions.

The interconnections between the string selection lines and the metal lines as strapping lines may offer a number of features. For example, resistance along the string selection lines SSLi may be reduced through the interconnections between the string selection lines and the metal lines as strapping lines. This reduction in the resistance along the string selection lines SSLi may lead to a reduction of RC loading on the string selection lines SSLi. In addition, a reduction in RC loading may reduce the signal skew along the string selection lines SSLi.

As mentioned above, when a word line adjacent to the string selection line SSLi is driven with the pass voltage Vpass, a voltage of the string selection line SSLi may be boosted over a target voltage because of the coupling between the word line and the string selection line. Although the voltage of the string selection line SSLi is boosted up over the target voltage because of the coupling effect with the adjacent word line, in an exemplary embodiment, the flash memory device may be able to stabilize the boosted voltage of the string selection line SSLi to the target voltage in a shorter time because of the reduced RC loading on the string selection line SSLi. This means that the stabilizing time (illustrated by Dt1 in FIG. 2), i.e., a time for recovering (or stabilizing) the boosted voltage of the string selection line SSLi to the target voltage, can be shortened. Such a reduction of the stabilizing time may help reduce the delay in applying the program voltage Vpgm to selected word lines. As a result, it may be possible to shorten a programming time of the flash memory device. In particular, the reduced RC loading on the string selection line may be effective in reducing a programming time in a multi-bit flash memory device that has a large number of programming loops, as well as in a single-bit flash memory device.

Furthermore, with a reduction of the RC loading on the string selection line SSLi, a voltage of the string selection line SSLi which is boosted up when the pass voltage Vpass is applied to the adjacent word line, i.e., a peak voltage, may be lowered in proportion to the reduced RC loading thereon. Therefore, compared with the pass voltage window illustrated in FIG. 2, a pass voltage window margin in an exemplary embodiment may be improved along a descent of the boosted peak voltage.

Figure 4:
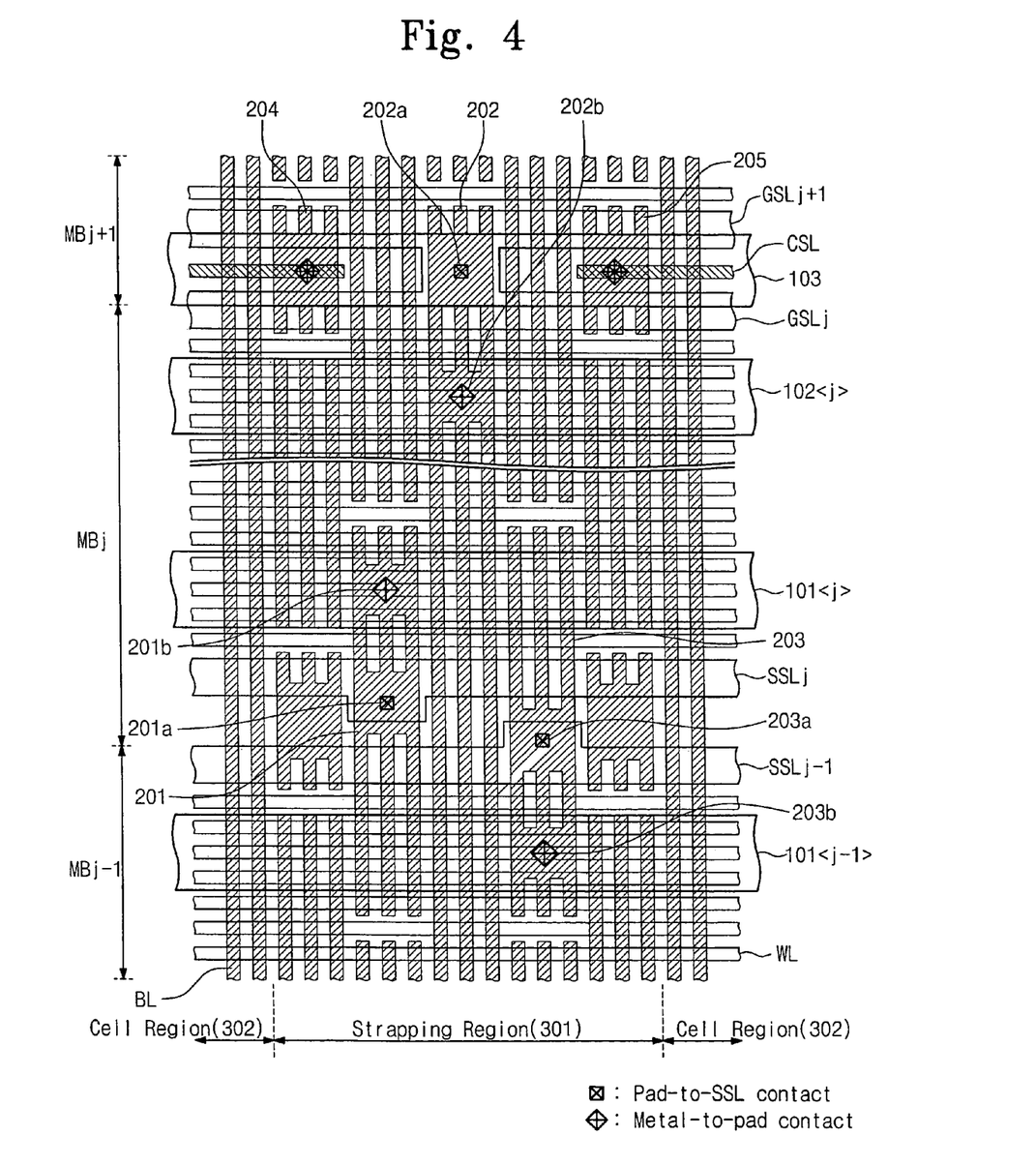
FIGS. 4 and 5 are layout diagrams illustrating the array structure shown in FIG. 3.

FIG. 4 is a layout diagram partially illustrating the array structure with the memory blocks shown in FIG. 3 in accordance with an exemplary disclosed embodiment. Specifically, FIG. 4 shows a plane pattern of the layout with three memory blocks (e.g., MBj−1, MBj, and MBj+1).

The memory block MBj may include a plurality of word lines WL, a plurality of bit lines BL, a string selection line SSLj, and a ground selection line GSLj. In particular, the word lines WL and the selection lines SSLj and GSLj are arranged as rows, while the bit lines BL are arranged as columns. Furthermore, the memory block MBj is divided into a cell region 302 and a strapping region 301. Alternatively, the strapping region 301 may be also confined within the cell region 302. The bit lines BL are arranged in the strapping region 301 as well as the cell region 302. In particular, the bit lines arranged in the strapping region 301 are used to connect the metal lines, which are provided as the strapping lines, with the ground selection lines as well as the string selection lines.

For example, the string selection line SSLj of the memory block MBj is electrically connected to a bit-line contact pad 201 disposed in the strapping region 301. The bit-line contact pad 201 is also connected to a strapping metal line 101<j>. In FIG. 4, 201a denotes a contact (referred to as 'pad-SSL contact) which electrically connects the contact pad 201 with the string selection line SSLj, while 201b denotes a contact (referred to as 'metal-pad contact') for electrically connecting the strapping metal line 101<j> with the contact pad 201. Similarly, the ground selection line GSLj of the memory block MBj is electrically connected to a bit-line contact pad 202 disposed in the strapping region 301. Furthermore, the bit-line contact pad 202 is also connected to a strapping metal line 102<j>. In FIG. 4, 202a denotes a contact (referred to as 'pad-GSL contact) which electrically connects the contact pad 202 with the string selection line GSLj, while 202b denotes a contact (referred to as 'metal-pad contact') which electrically connects the strapping metal line 102<j> with the contact pad 202.

Similarly, the string selection line SSLj−1 of the memory block MBj−1 is electrically connected to a bit-line contact pad 203 disposed in the strapping region 301. The bit-line contact pad 203 is also connected to a strapping metal line 101<j−1>. In FIG. 4, 203a denotes a contact (referred to as 'pad-SSL contact) which electrically connects the contact pad 203 with the string selection line SSLj−1, while 203b denotes a contact (referred to as 'metal-pad contact') which electrically connects the strapping metal line 101<j−1> with the contact pad 203.

As also illustrated in FIG. 4, the ground selection line GSLj+1 of the memory block MBj+1 is formed to be shared along with the ground selection line GSLj of the memory block MBj, and a common source line CSL is shared by its adjacent memory blocks (e.g., MBj and MBj+1). Furthermore, the common source line CSL is divided into two parts by the strapping region 301. In addition, the divided parts of the common source line CSL are electrically connected to the strapping metal line 103 through their respective bit-line pads.

As seen in FIG. 4, one bit-line contact pad is formed with three bit lines. Thus, 15 bit lines are arranged in the strapping region 301. However, the number of bit lines arranged in the strapping region 301 may be adjusted in accordance with any scheme of arranging the bit-line contact pads or any design rule. In an exemplary embodiment, the bit-line contact pad 202 for the ground selection lines GSLi/GSLi+1 is disposed between the bit-line contact pad 201 for the string selection line SSLj and the bit-line contact pad 203 for the string selection line SSLj−1.

Figure 5:
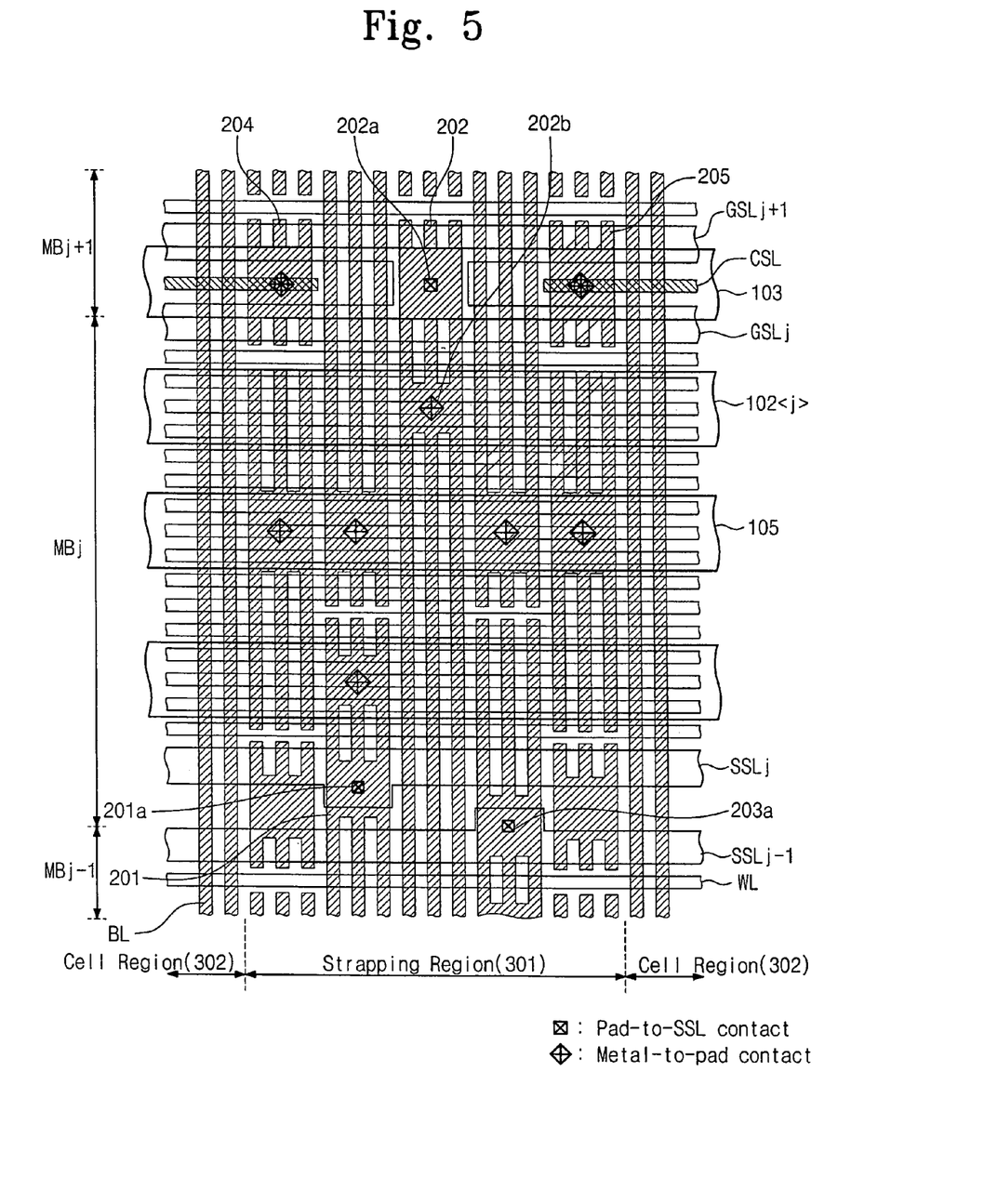

As shown in FIG. 4, the bit line segments for the bit line pads are electrically isolated from the other bit line segments in the strapping region. More particularly, the other bit line segments are conditioned in floating states. However, the bit line segments in floating states may affect their adjacent bit lines during a normal operation. Therefore, in an exemplary embodiment, as shown in FIG. 5, the floated bit lines arranged in the strapping region 301 may be electrically connected to a metal line 105. The metal line 105 electrically links with a pocket P-well including memory cells. A strapping scheme for a pocket P-well is exemplarily described in U.S. Pat. No. 6,611,460 entitled 'NONVOLATILE SEMICONDUCTOR MEMORY DEVICE AND PROGRAMMING METHOD THEREOF', which is incorporated by reference.

Figure 6:
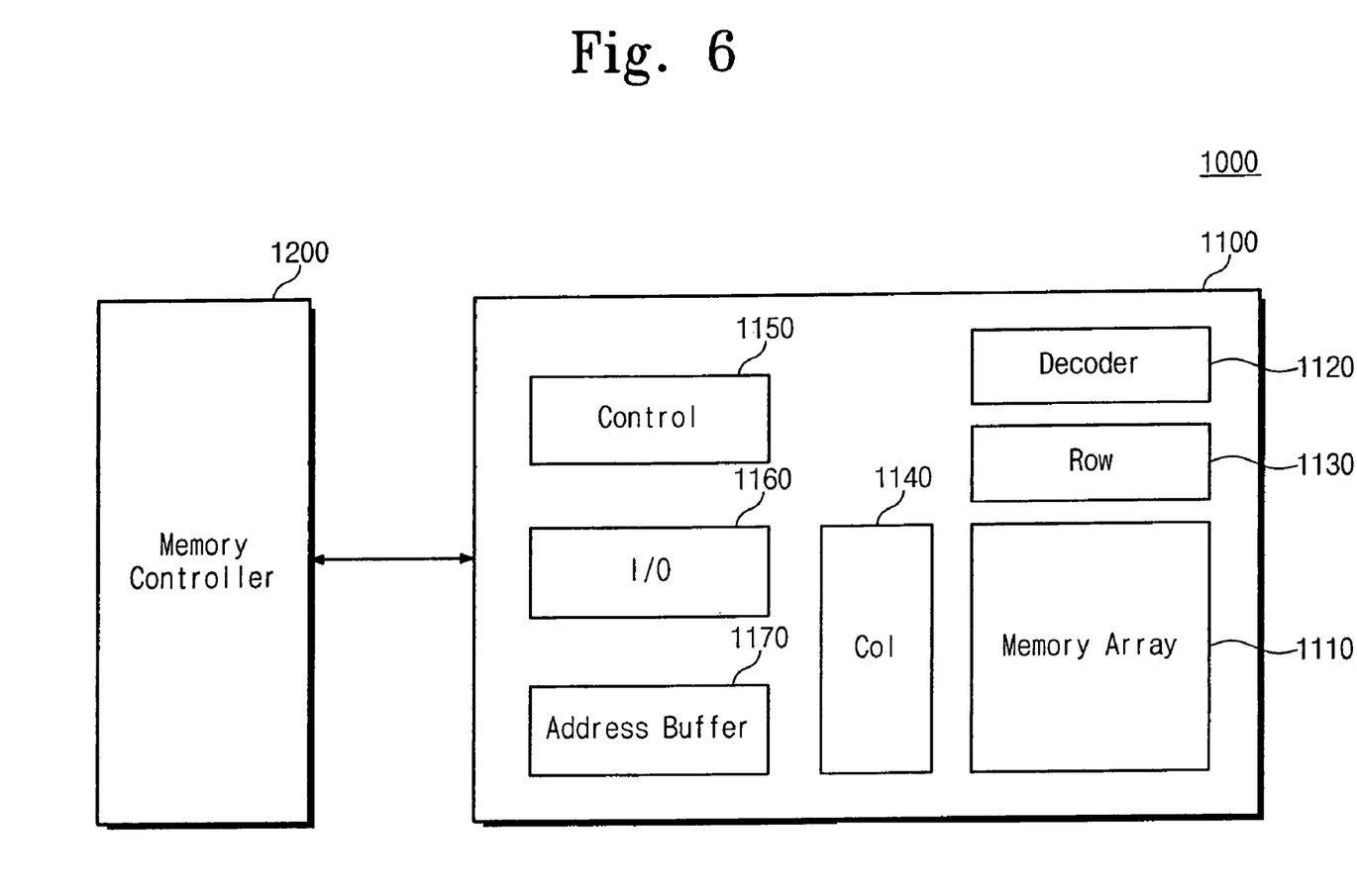
FIG. 6 is a block diagram illustrating a memory system in accordance with an exemplary disclosed embodiment.

FIG. 6 is a block diagram schematically illustrating a memory system according to an exemplary disclosed embodiment. Referring to FIG. 6, the memory system 1000 is comprised of an integrated circuit NAND flash memory device 1100 and a memory controller 1200. The NAND flash memory device 1100 includes an array 1110 with flash memory cells, an address decoder 1120, a row access circuit 1130, a column access circuit 1140, a controller 1150, an input/output circuit 1160, and an address buffer 1170. The array 1110 of the flash memory cells may be configured like that shown in FIGS. 3 through 5. Furthermore, the memory controller (or microcontroller) 1200 is coupled to the memory device 1100 for memory access as a component of an electronic system. Specifically, the memory device 1100 receives address signals from the memory controller 1200 and the input address signals are decoded by the address decoder 1120 so as to access the memory device 1100. Furthermore, the address buffer 1170 latches the address signals in response to control signals and the address signals. It is also permissible to use the memory system with other circuits and control signals.

The above-described memory system may be used in any non-volatile memory device. As described above, the disclosed memory system may reduce a rate of RC loading on the string selection lines by connecting the string selection lines with the metal lines used as strapping lines. The reduction of RC loading on the string selection lines may improve the operation the flash memory device by reducing signal skew along the string selection line, by reducing the programming time, any by increasing the pass voltage window margin.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A NAND flash array comprising:
   a first selection transistor coupled to a first selection line;
   a second selection transistor coupled to a second selection line;
   memory cells operably coupled to word lines and connected to each other in series between the first and second selection transistors;
   a strapping line electrically connected to the first selection line; and
   a strapping region including bit lines;
   wherein the strapping line is electrically connected to the first selection line through a contact pad formed of the bit lines in the strapping region.

2. The NAND flash array as set forth in claim 1, wherein bit line segments other than bit lines segments for the contact pad are biased to be inhibited from a floating voltage state.

3. The NAND flash array as set forth in claim 2, wherein the bit line segments other than the bit lines segments for the contact pad are electrically connected to a metal line which supplies a well bias of a pocket P-well in which the memory cells are located.

4. The NAND flash array as set forth in claim 1, wherein the strapping line is formed of a conductive material and is wider than the first selection line.

5. The NAND flash array as set forth in claim 1, wherein the first selection line is a string selection line and the second selection line is a ground selection line.

6. The NAND flash array as set forth in claim 1, wherein the strapping line is formed of a metal line of a material including a metal.

7. A NAND flash array comprising:
   a first selection transistor coupled to a first selection line;
   a second selection transistor coupled to a second selection line;
   memory cells operably coupled to word lines and connected in series between the first and second selection transistors;
   a first strapping line electrically connected to the first selection line;
   a second strapping line electrically connected to the second selection line; and
   a strapping line including bit lines;
   wherein the first and second strapping lines are electrically connected to the first and second selection lines through contact pads formed of the bit lines included in the strapping region.

8. The NAND flash array as set forth in claim 7, wherein the first selection line is a string selection line and the second selection line is a ground selection line.

9. The NAND flash array as set forth in claim 7, wherein bit line segments other than bit line segments for the contact pads are biased to be inhibited from a floating voltage state.

10. The NAND flash array as set forth in claim 9, wherein the bit line segments other than the bit line segments for the contact pads are electrically connected to a metal line which supplies a well bias of a pocket P-well in which the memory cells are located.

11. A NAND flash array comprising:
    a cell region including memory cells;
    a strapping region including bit lines, disposed in the cell region;
    a string selection line arranged in the cell region;
    a ground selection line arranged in the cell region;
    word lines arranged between the string and ground selection lines; and
    a first strapping line electrically connected to the string selection line through a first contact pad formed of the bit lines in the strapping region.

12. The NAND flash array as set forth in claim 11, further comprising a second strapping line electrically connected to the ground selection line through a second contact pad formed of the bit lines arranged in the strapping region.

13. The NAND flash array as set forth in claim 12, wherein bit line segments other than bit line segments for the first and second contact pads are biased to be inhibited from a floating voltage state.

14. The NAND flash array as set forth in claim 13, wherein the bit line segments other than the bit line segments for the first and second contact pads are electrically connected to a metal line which supplies a well bias of a pocket P-well in which the memory cells are located.

15. The NAND flash array as set forth in claim 11, further comprising:
    a common source line; and a second strapping line electrically connected to the common source line through the first contact pad formed of the bit lines included in the strapping region.

16. A NAND flash array comprising:
a plurality of memory blocks,
wherein each memory block comprises a plurality of strings, each string being connected to a first bit line,
wherein each string comprises:
   a string selection transistor connected to a string selection line;
   a ground selection transistor connected to a ground selection line and a common source line;
   memory cells operably coupled to word lines and connected to each other in series between the string and ground selection transistors; and
   a first strapping line electrically connected to the string selection line;
wherein the NAND flash array further comprises a second strapping line electrically connected to the ground selection line;
wherein the first and second strapping lines are electrically connected to the first and second selection lines through contact pads formed of the bit lines included in the strapping region; and
wherein the first strapping line is electrically connected to the string selection line through a first contact pad formed of the second bit lines arranged in the strapping region, and the second strapping line is electrically connected to the ground selection line through a second contact pad formed of the second bit lines arranged in the strapping region.

17. The NAND flash array as set forth in claim 16, wherein the strapping region is disposed in the cell region.

18. The NAND flash array as set forth in claim 16, wherein bit line segments other than bit line segments for the first and second contact pads are biased to be inhibited from a floating voltage state.

19. The NAND flash array as set forth in claim 18, wherein the bit line segments other than bit line segments for the first and second contact pads are electrically connected to a metal line which supplies a well bias of a pocket P-well in which the memory cells are located.

20. A NAND flash array comprising:
a plurality of memory blocks,
wherein each memory block comprises a plurality of strings, each string being connected to a first bit line,
wherein each string comprises:
   a string selection transistor connected to a string selection line;
   a ground selection transistor connected to a ground selection line and a common source line;
   memory cells operably coupled to word lines and connected to each other in series between the string and ground selection transistors; and
   a first strapping line electrically connected to the string selection line;
wherein the NAND flash array further comprises a second strapping line electrically connected to the common source line through a contact pad formed of bit lines arranged in the strapping region.

* * * * *